(12) United States Patent
Tseng (10) Patent No.: US 8,525,558 B2
(45) Date of Patent: Sep. 3, 2013

(54) OPERATIONAL CIRCUIT AND RELATED CONTROL METHOD

(75) Inventor: Wei-Kai Tseng, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 327 days.

(21) Appl. No.: 12/845,689

(22) Filed: Jul. 28, 2010

(65) Prior Publication Data

US 2011/0156762 A1    Jun. 30, 2011

Related U.S. Application Data

(63) Continuation-in-part of application No. 12/650,481, filed on Dec. 30, 2009, now Pat. No. 8,054,107.

(51) Int. Cl.
*H03K 3/00*    (2006.01)

(52) U.S. Cl.
USPC .......................................................... 327/108

(58) Field of Classification Search
None
See application file for complete search history.

(56) References Cited

U.S. PATENT DOCUMENTS

| 4,859,870 | A | * | 8/1989 | Wong et al. ................... 327/108 |
| 5,049,834 | A | | 9/1991 | Kasai |
| 5,467,058 | A | * | 11/1995 | Fujita ............................. 330/267 |
| 5,585,763 | A | * | 12/1996 | Navabi et al. .................. 330/255 |
| 6,768,367 | B1 | | 7/2004 | Meadows |
| 7,242,250 | B2 | * | 7/2007 | Tsurumi ........................ 330/265 |
| 7,724,089 | B2 | * | 5/2010 | Miyamoto et al. ............. 330/255 |

* cited by examiner

*Primary Examiner* — Lincoln Donovan
*Assistant Examiner* — Khareem E Almo
(74) *Attorney, Agent, or Firm* — Winston Hsu; Scott Margo (57) ABSTRACT

An operational circuit includes: a first stage having a first input terminal for receiving an input signal and a second input terminal for receiving an output signal of the operational circuit, for outputting a first control signal at a first output terminal and a second control signal at a second output terminal according to the input signal and the output signal; and a second stage coupled to the first stage, for generating the output signal according to a first driving current controlled by the first control signal and a second driving current controlled by the second control signal; and a protection circuit coupled between the first stage and the second stage, for adjusting the first driving current from a first predetermined threshold current toward a second predetermined threshold current when the first driving current reaches the first predetermined threshold current.

10 Claims, 5 Drawing Sheets

OPERATIONAL CIRCUIT AND RELATED CONTROL METHOD

CROSS REFERENCE TO RELATED APPLICATIONS

This application is a continuation-in-part of U.S. application Ser. No. 12/650,481 filed Dec. 30, 2009.

BACKGROUND OF THE INVENTION

1. Field of the Invention

The present invention relates to a current driving circuit and related control method, and more particularly to a current driving circuit having a small and stable leakage current, and a control method thereof.

2. Description of the Prior Art

A current driving circuit is utilized to generate a large current according to an input voltage. To sustain the large current, an output stage of the current driving circuit is designed to have a large size. In other words, the driving transistors of the output stage possess a large aspect ratio (Width/Length, W/L). Since the driving capability of the output stage transistors is strong, a malfunction current will be induced, which may seriously affect the normal operation of the whole system connected to the current driving circuit. For example, when the output terminal of the current driving circuit is misconnected to the ground voltage or the supply voltage, a large error-current may be induced to flow through the driving transistor between the ground voltage and the output terminal, or through the driving transistor between the supply voltage and the output terminal. This large error-current will damage the path between the driving transistor and the ground voltage, or the path between the driving transistor and the supply voltage. Moreover, the large error-current may shift the voltage level of the ground voltage or the supply voltage by an offset voltage such that the other functional circuits coupled to the ground voltage or the supply voltage will be affected, thereby generating malfunctions. Providing an efficient and stable current detecting method for a current driving circuit is therefore a significant concern in the field of current drivers.

SUMMARY OF THE INVENTION

One of the objectives of the present invention is to provide a current driving circuit having a small and stable leakage current, and a control method thereof.

According to a first embodiment of the present invention, an operational circuit is disclosed. The operational circuit comprises a first stage, a second stage, and a protection circuit. The first stage has a first input terminal for receiving an input signal and a second input terminal for receiving an output signal of the operational circuit, for outputting a first control signal at a first output terminal and a second control signal at a second output terminal according to the input signal and the output signal. The second stage is coupled to the first stage for generating the output signal according to a first driving current controlled by the first control signal and a second driving current controlled by the second control signal. The protection circuit is coupled between the first stage and the second stage for adjusting the first driving current from a first predetermined threshold current toward a second predetermined threshold current when the first driving current reaches the first predetermined threshold current.

According to a second embodiment of the present invention, a control method for an operational circuit is disclosed. The operational circuit comprises: a first stage having a first input terminal for receiving an input signal and a second input terminal for receiving an output signal of the operational circuit, for outputting a first control signal at a first output terminal and a second control signal at a second output terminal according to the input signal and the output signal; and a second stage for generating the output signal according to a first driving current controlled by the first control signal and a second driving current controlled by the second control signal. The control method comprises sensing the first driving current, and adjusting the first driving current from a first predetermined threshold current towards a second predetermined threshold current when the first driving current reaches the first predetermined threshold current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
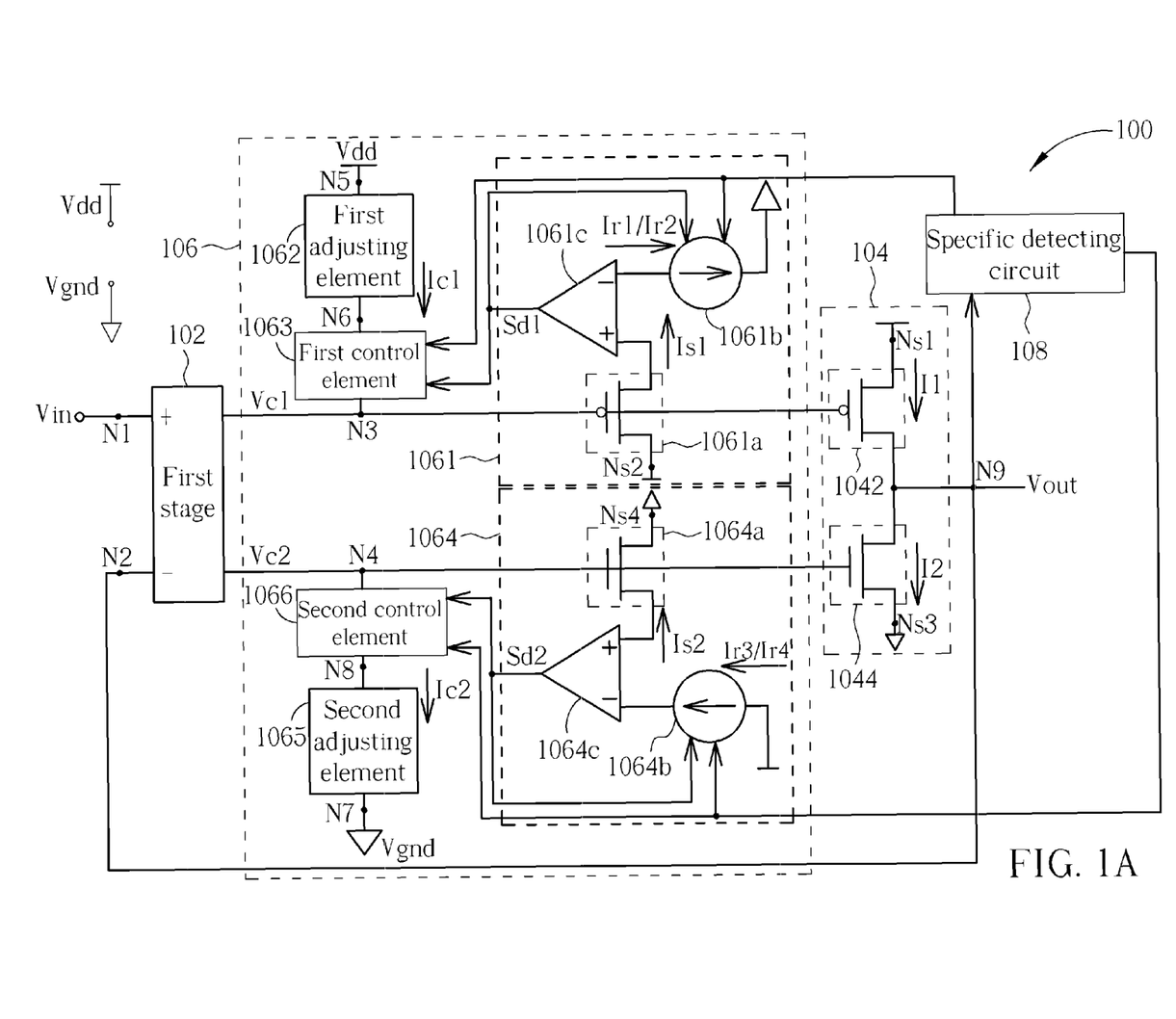
FIG. 1A is a diagram illustrating an operational circuit according to an embodiment of the present invention.

Please refer to FIG. 1A. FIG. 1A is a diagram illustrating an operational circuit 100 according to an embodiment of the present invention. The operational circuit 100 comprises a first stage 102, a second stage 104, and a protection circuit 106. The first stage 102 has a first input terminal N1 for receiving an input signal Vin and a second input terminal N2 for receiving an output signal Vout of the operational circuit 100, wherein the first stage 102 generates a first control signal Vc1 and a second control signal Vc2 according to the input signal Vin and the output signal Vout. The second stage 104 is coupled to the first stage 102 for generating the output signal Vout according to a first driving current I1 controlled by the first control signal Vc1 and a second driving current I2 controlled by the second control signal Vc2. The protection circuit 106 is coupled to the first stage 102 and the second stage 104 for generating a first sensing current Is1 with respect to the first driving current I1. Before the first driving current I1 reaches a first predetermined threshold current Ith1, the protection circuit 106 compares the first sensing current Is1 with a first reference current Ir1 with respect to the first predetermined threshold current Ith1, and when the first driving current I1 reaches the first predetermined threshold current Ith1, the protection circuit 106 compares the first sensing current Is1 with a second reference current Ir2 with respect to a second predetermined threshold current Ith2 to adjust the first control signal Vc1 to thereby adjust the first driving current I1 from the first predetermined threshold current Ith1 towards the second predetermined threshold current Ith2. More specifically, the protection circuit 106 is coupled to the two common nodes (i.e., N3, N4) of the outputs of the first stage 102 and the inputs of the second stage 104 respectively. In this embodiment, the protection circuit 106 further generates a second sensing current Is2 with respect to the second driving current I2. Before the second driving current I2 reaches a third predetermined threshold current Ith3, the protection circuit 106 compares the second sensing current Is2 with a third reference current Ir3 with respect to the third predetermined threshold current Ith3, and when the second driving current I2 reaches the third predetermined threshold current Ith3, the protection circuit 106 compares the second sensing current Is2 with a fourth reference current Ir4 with respect to a fourth predetermined threshold current Ith4 to adjust the second control signal Vc2 to thereby adjust the second driving current I2 from the third predetermined threshold current Ith3 towards the fourth predetermined threshold current Ith4. Therefore, the magnitude of the first predetermined threshold current Ith1 is larger than the magnitude of the second predetermined threshold current Ith2, and the magnitude of the third predetermined threshold current Ith3 is larger than the magnitude of the fourth predetermined threshold current Ith4. Furthermore, Ith1=n1*Ir1, Ith2=n2*Ir2, Ith3=n3*Ir3, Ith4=n4*Ir4, wherein n1, n2, n3, n4 are any value larger than one. In this embodiment, n1=n2=n3=n4=n, and n is a positive integer number.

Please note that the protection circuit 106 is not limited to adjusting both the first control signal Vc1 and the second control signal Vc2. In one embodiment of the present invention, the protection circuit 106 only adjusts the first control signal Vc1, and in another embodiment of the present invention, the protection circuit 106 only adjusts the second control signal Vc2.

In addition, the second stage 104 comprises a first driving element 1042 and a second driving element 1044, wherein the first driving element 1042 is a P-type field effect transistor and the second driving element 1044 is an N-type field effect transistor. The first driving element 1042 is coupled to a first output terminal N3 of the first stage 102 for receiving the first control signal Vc1 to generate the first driving current I1. The second driving element 1044 is coupled to a second output terminal N4 of the first stage 102 for receiving the second control signal Vc2 to generate the second driving current I2. The protection circuit 106 comprises a first detecting element 1061, a first adjusting element 1062, a first control element 1063, a second detecting element 1064, a second adjusting element 1065, and a second control element 1066. The first detecting element 1061 comprises a first sensing element 1061a, a first adjustable current generator 1061b, and a first current comparator 1061c. The second detecting element 1064 comprises a second sensing element 1064a, a second adjustable current generator 1064b, and a second current comparator 1064c. The first detecting element 1061 detects the first driving current I1 to selectively generate a first detecting signal Sd1. The first adjusting element 1062 has a first terminal N5 coupled to a first supply voltage Vdd (i.e. a power supply). The first control element 1063 has a first terminal N6 coupled to a second terminal of the first adjusting element 1062, and a second terminal coupled to the first output terminal N3 of the first stage 102, wherein the first detecting element 1061 generates the first detecting signal Sd1 to adjust a conductivity between the first terminal N6 of the first control element 1063 and the second terminal (i.e., N3) of the first control element 1063 when the first driving current I1 reaches the first predetermined threshold current Ith1. The second detecting element 1064 detects the second driving current I2 to selectively generate a second detecting signal Sd2. The second adjusting element 1065 has a first terminal N7 coupled to a second supply voltage Vgnd (i.e. a ground voltage). The second control element 1066 has a first terminal N8 coupled to a second terminal of the second adjusting element 1065, and a second terminal coupled to the second output terminal N4 of the first stage 102, wherein the second detecting element 1064 generates the second detecting signal Sd2 to adjust a conductivity between the first terminal N8 of the second control element 1066 and the second terminal (i.e., N4) of the second control element 1066 when the second driving current I2 reaches the third predetermined threshold current Ith3.

In addition, the first sensing element 1061a is coupled to the first output terminal N3 for sensing the first driving current I1 to generate the first sensing current Is1. The first adjustable current generator 1061b selectively generates the first reference current Ir1 with respect to the first predetermined threshold current Ith1 or the second reference current Ir2 with respect to the second predetermined threshold current Ith2. The first current comparator 1061c is coupled to the first sensing element 1061a and the first adjustable current generator 1061b for comparing the first sensing current Is1 and the first reference current Ir1 before the first driving current I1 reaches the first predetermined threshold current Ith1, and comparing the first sensing current Is1 and the second reference current Ir2 to generate the first detecting signal Sd1 when the first driving current I1 reaches the first predetermined threshold current Ith1. The second sensing element 1064a is coupled to the second output terminal N4 for sensing the second driving current I2 to generate the second sensing current Is2. The second adjustable current generator 1064b selectively generates the third reference current Ir3 with respect to the third predetermined threshold current Ith3 or the fourth reference current Ir4 with respect to the fourth predetermined threshold current Ith4. The second current comparator 1064c is coupled to the second sensing element 1064a and the second adjustable current generator 1064b for comparing the second sensing current Is2 and the third reference current Ir3 before the second driving current I2 reaches the third predetermined threshold current Ith3, and comparing the second sensing current Is2 and the fourth reference current Ir4 to generate the second detecting signal Sd2 when the second driving current I2 reaches the third predetermined threshold current Ith3.

In this embodiment, the first sensing element 1061a is a P-type field effect transistor and the second sensing element 1064a is an N-type field effect transistor. More specifically, the first sensing element 1061a is configured to mirror the first driving current I1 to generate the first sensing current Is1, and the second sensing element 1064a is configured to mirror the second driving current I2 to generate the second sensing current Is2 as shown in FIG. 1A. Since the first driving element 1042 is implemented by a P-type field effect transistor, the first sensing element 1061a is implemented by another P-type field effect transistor to mirror the first driving current I1 to generate the first sensing current Is1. Similarly, since the second driving element 1044 is implemented by an N-type field effect transistor, the second sensing element 1064a is implemented by another N-type field effect transistor to mirror the second driving current I2 to generate the second sensing current Is2. Furthermore, in this embodiment, the ratio between the sizes (i.e., aspect ratio W/L) of the P-type field effect transistor of the first driving element 1042 and the P-type field effect transistor of the first sensing element 1061a equals the above-mentioned current ratio, i.e., n. Similarly, the ratio between the sizes (i.e., aspect ratio W/L) of the P-type field effect transistor of the second driving element 1044 and the P-type field effect transistor of the second sensing element 1064a equals n. Accordingly, the current consumptions of the first detecting element 1061 and the second detecting element 1064 can be reduced to extremely low levels by setting the number of n to be as large as possible.

Please refer to FIG. 1A. The source terminals of the P-type field effect transistors of first driving element 1042 and the first sensing element 1061a are labeled as Ns1 and Ns2 respectively, and the source terminals of the N-type field effect transistors of second driving element 1044 and the second sensing element 1064a are labeled as Ns3 and Ns4 respectively. Accordingly, the voltage drop between the source terminal Ns1 and the gate terminal (i.e., N3) of the P-type field effect transistor of the first driving element 1042 equals the voltage drop between the source terminal Ns2 and the gate terminal (i.e., N3) of the P-type field effect transistor of the first sensing element 1061a, and the voltage drop between the source terminal Ns3 and the gate terminal (i.e., N4) of the N-type field effect transistor of second driving element 1044 equals the voltage drop between the source terminal Ns4 and the gate terminal (i.e., N4) of the N-type field effect transistor of the second sensing element 1064a. Therefore, the first sensing current Is1 is a mirrored current of the first driving current I1, and the second sensing current Is2 is a mirrored current of the second driving current I2. Furthermore, in this embodiment, the first adjusting element 1062 is a current generator for providing a first control current Ic1 when the first detecting element 1061 adjusts the conductivity between the first terminal N6 of the first control element 1063 and the second terminal (i.e. N3) of the first control element 1063, and the second adjusting element 1065 is a current generator for providing a second control current Ic2 when the second detecting element 1064 adjusts the conductivity between the first terminal N8 of the second control element 1066 and the second terminal (i.e. N4) of the second control element 1066, but this is not meant to be a limitation of the present invention. In another embodiment of the present invention, the first adjustable current generator 1061b, the first adjusting element 1062, the second adjustable current generator 1064b and the second adjusting element 1065 can be implemented by four current mirrors respectively.

Please refer to FIG. 1A again. When the first driving current I1 reaches the first predetermined threshold current Ith1, the first current comparator 1061c generates the first detecting signal Sd1 accordingly, and the first detecting signal Sd1 is further arranged to control the first adjustable current generator 1061b to switch the first reference current Ir1 into the second reference current Ir2. Similarly, when the second driving current I2 reaches the third predetermined threshold current Ith3, the second current comparator 1064c generates the second detecting signal Sd2 accordingly, and the second detecting signal Sd2 is further arranged to control the second adjustable current generator 1064b to switch the third reference current Ir3 into the fourth reference current Ir4.

Figure 1B:
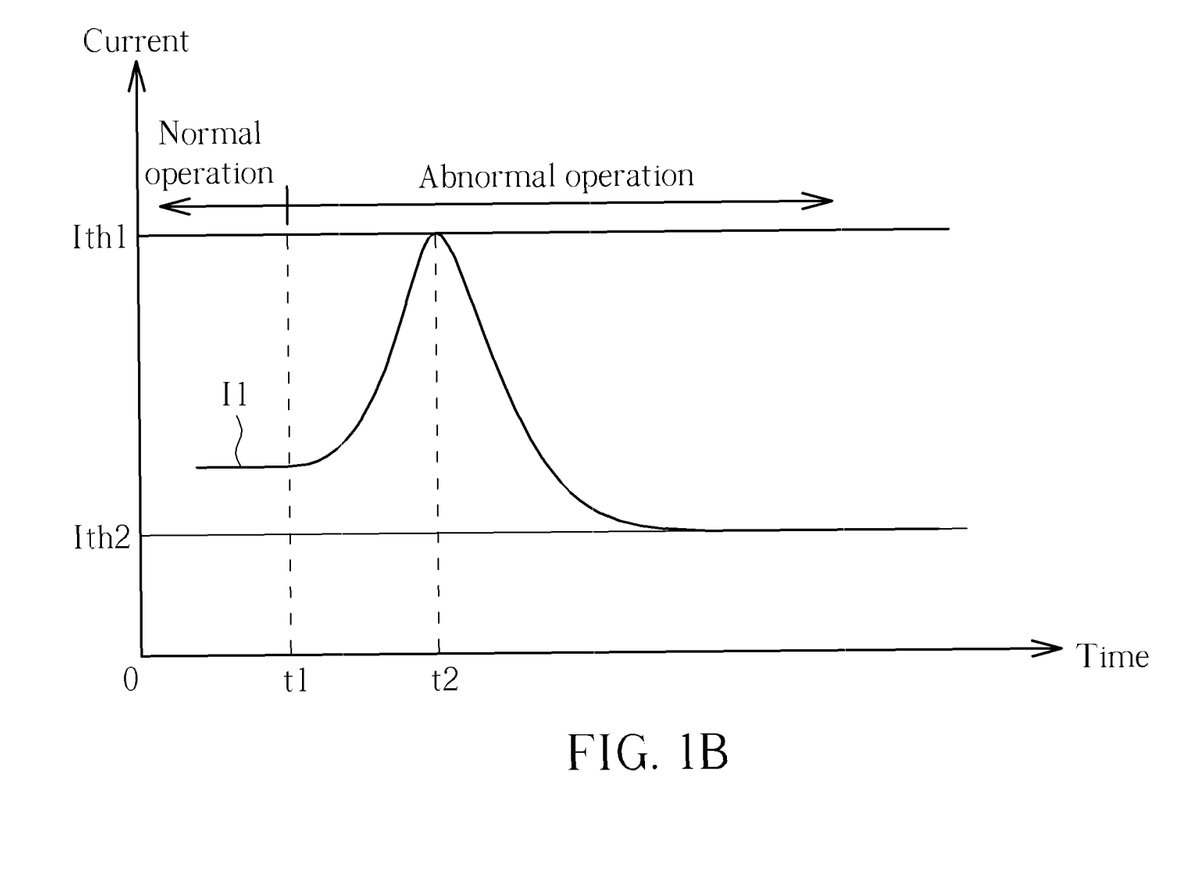
FIG. 1B is a timing diagram illustrating the variation of a first driving current when the operational circuit is operated under normal operation and abnormal operation.

When the operational circuit 100 is operative, the first driving current I1 is a sourcing current of the second stage 104, i.e., the first driving current I1 is operated to provide a current to the output terminal N9. The second driving current I2 is a sinking current of the second stage 104, i.e., the second driving current I2 is operated to sink a current from the output terminal N9. In addition, when the operational circuit 100 is under normal operation, the first control element 1063 and the second control element 1066 are operated as switch elements. In other words, when the operational circuit 100 is under normal operation, the first control element 1063 and the second control element 1066 are open (i.e., switched off). More specifically, when the operational circuit 100 is under normal operation, the magnitude of the first sensing current Is1 is smaller than the magnitude of the first reference current Ir1, and the magnitude of the second sensing current Is2 is smaller than the magnitude of the third reference current Ir3, and the present protection circuit 106 is in standby. Please refer to FIG. 1B. FIG. 1B is a timing diagram illustrating the variation of the first driving current I1 when the operational circuit 100 is operated under normal operation and abnormal operation. When the operational circuit 100 is operated under normal operation, the first adjustable current generator 1061b is controlled to generate the first reference current Ir1. Then, the first sensing current Is1 will be smaller than the first reference current Ir1 since the first driving current I1 is smaller the first predetermined threshold current Ith1 under the normal operation. Consequently, the specific detecting circuit 108 disconnects (i.e., switches off) the first terminal N6 of the first control element 1063 from the second terminal (i.e., N3) of the first control element 1063. Similarly, the specific detecting circuit 108 disconnects (i.e., switches off) the first terminal N8 of the second control element 1066 from the second terminal (i.e., N4) of the second control element 1066 under the normal operation. The detailed description is omitted here for brevity.

Figure 2:
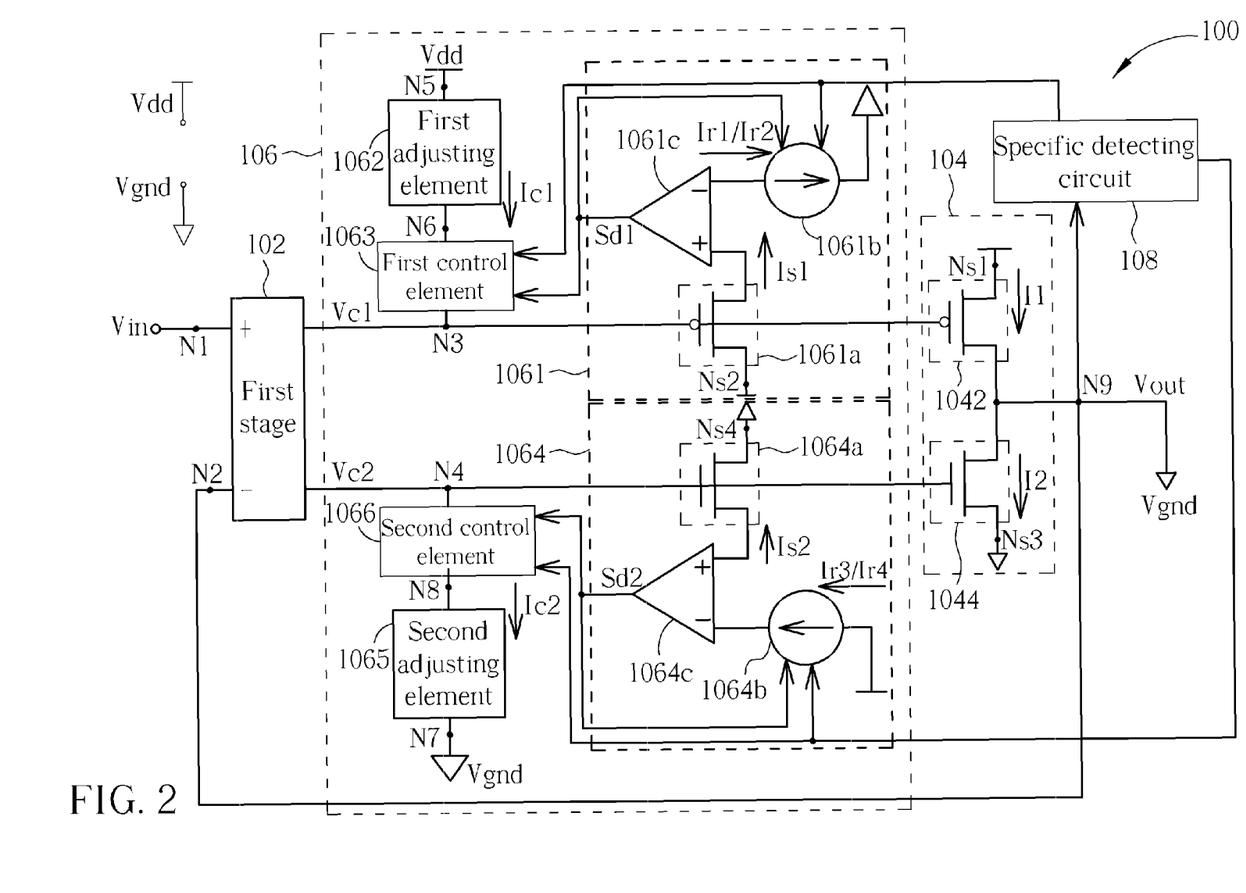
FIG. 2 is a diagram illustrating the case of misconnecting an output terminal of the operational circuit to a ground voltage.

However, when the output terminal N9 of the second stage 104 is misconnected to the ground voltage Vgnd at time t1 (i.e., the operational circuit 100 enters the abnormal operation), a large driving current I1 may be induced to flow from the supply voltage Vdd to the output terminal N9 after time t1 (i.e., through the first driving element 1042) as shown in FIG. 1B and FIG. 2. FIG. 2 is a diagram illustrating the case of misconnecting the output terminal N9 of the operational circuit 100 to the ground voltage Vgnd. In this case, when the first driving current I1 reaches or is slightly larger than the first predetermined threshold current Ith1, the first sensing current Is1 will also be larger than the first reference current Ir1. Then, the first current comparator 1061c outputs the first detecting signal Sd1 to switch the first reference current Ir1 into the second reference current Ir2, and the first detecting signal Sd1 is also arranged to adjust the conductivity between the first terminal N6 of the first control element 1063 and the second terminal (i.e., N3) of the first control element 1063 to lock the first driving current I1 into the second predetermined threshold current Ith2 as shown in FIG. 1B. In other words, the first detecting element 1061, the first adjusting element 1062, and the first control element 1063 are configured as a negative feedback loop to lock the first driving current I1 into the second predetermined threshold current Ith2 when the operational circuit 100 enters the abnormal operation. More specifically, since the voltage drop between the source terminal Ns1 and the gate terminal (i.e., N3) of the P-type field effect transistor of first driving element 1042 equals the voltage drop between the source terminal Ns2 and the gate terminal (i.e., N3) of the P-type field effect transistor of the first sensing element 1061a, the first driving current I1 is mirrored to the first sensing element 1061a such that the first sensing current Is1 is also a large current when the first driving current I1 becomes a large current. The first control current Ic1 is then fed to the first output terminal N3 of the first stage 102 through the first control element 1063 to increase the voltage level of the first control signal Vc1. Therefore, by reducing the dropout voltage between the gate terminal and the source terminal of the P-type field effect transistor (i.e., the first driving element 1042), the driving current I1 is reduced. Please note that, according to this embodiment, the above-mentioned feedback loop is designed to adjust the first control signal Vc1 to reduce the first driving current I1 to a target current level (i.e., the second predetermined threshold current Ith2) which is greater than zero. Then, the above-mentioned feedback loop maintains the first driving current I1 to lock to the second predetermined threshold current Ith2 until the output terminal N9 of the second stage 104 is disconnected from the ground voltage Vgnd. In other words, the first driving current I1 is reduced to a small leakage current (i.e., the second predetermined threshold current Ith2) when the operational circuit 100 enters the abnormal operation. When the output terminal N9 of the second stage 104 is disconnected from the ground voltage Vgnd and connected to a correct terminal, the operational circuit 100 enters the normal mode again. More specifically, when the specific detecting circuit 108 detects that the output terminal N9 is connected to a correct terminal, the specific detecting circuit 108 disconnects (i.e., switches off) the first terminal N6 of the first control element 1063 from the second terminal (i.e., N3) of the first control element 1063 and controls the first adjustable current generator 1061b to switch the second reference current Ir2 into the first reference current Ir1.

Please note that the present invention switches the first reference current Ir1 into the second reference current Ir2, and locks the first driving current I1 into the second predetermined threshold current Ith2 rather than directly connecting the first terminal N6 of the first control element 1063 to the supply voltage Vdd, which has the advantage of preventing the operational circuit 100 from oscillating.

Figure 3:
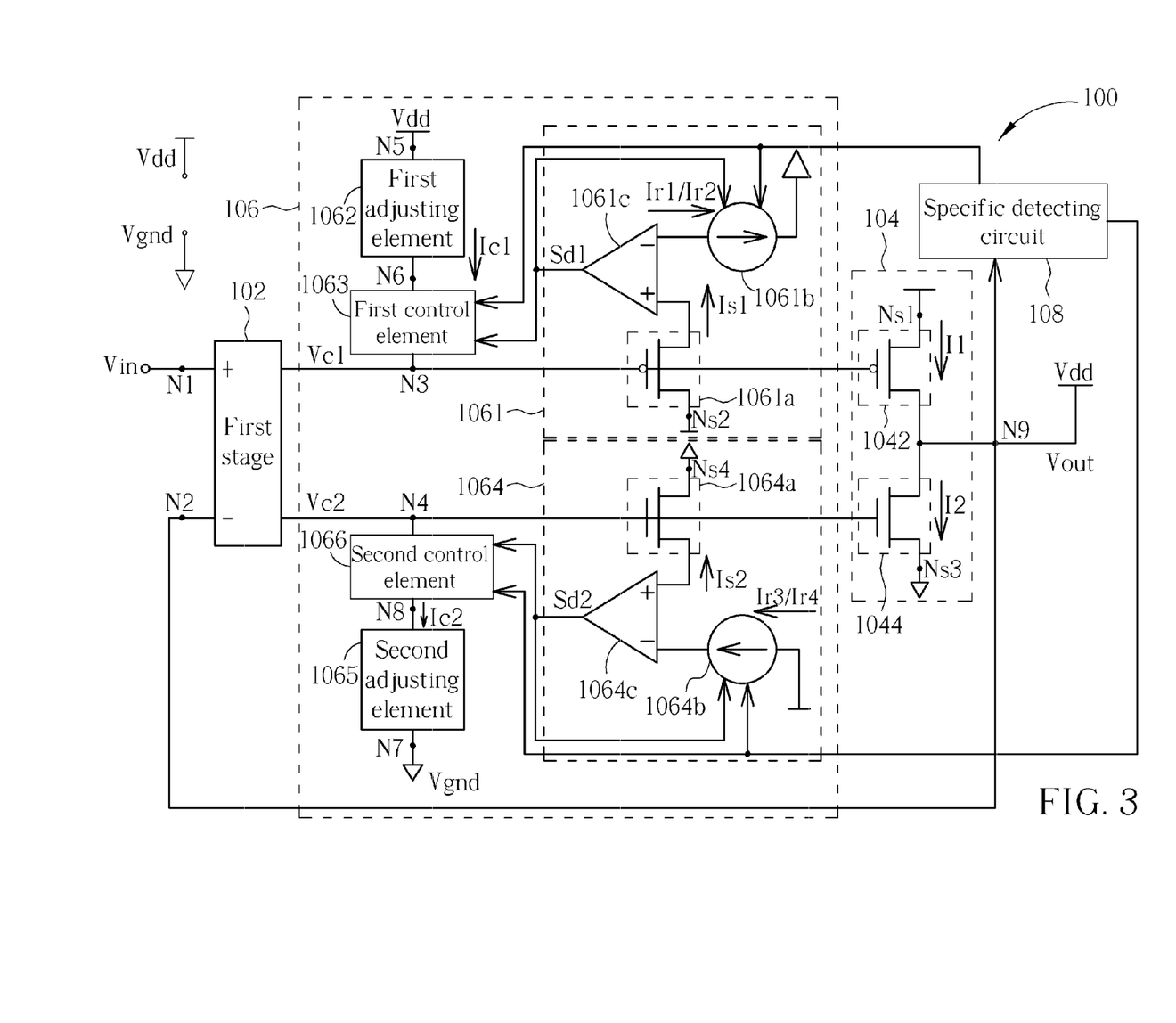
FIG. 3 is a diagram illustrating the case of misconnecting the output terminal of the operational circuit to a supply voltage.

If the output terminal N9 of the second stage 104 is misconnected to the supply voltage Vdd, a large driving current I2 may be induced to flow from the output terminal N9 to the ground voltage Vgnd (i.e., through the second driving element 1044) as shown in FIG. 3. FIG. 3 is a diagram illustrating the case of misconnecting the output terminal N9 of the operational circuit 100 to the supply voltage Vdd. In this situation, the second sensing current Is2 will eventually be larger than the third reference current Ir3. Then, the second current comparator 1064c outputs the second detecting signal Sd2 to switch the third reference current Ir3 into the fourth reference current Ir4, and the second detecting signal Sd2 is also arranged to adjust the conductivity between the first terminal N8 of the second control element 1066 and the second terminal (i.e., N4) of the second control element 1066 to lock the second driving current I2 into the fourth predetermined threshold current Ith4 similar to the case shown in FIG. 1B. In other words, the second detecting element 1064, the second adjusting element 1065, and the second control element 1066 are configured as a negative feedback loop to lock the second driving current I2 into the fourth predetermined threshold current Ith4 when the operational circuit 100 enters the abnormal operation. More specifically, since the voltage drop between the source terminal Ns3 and the gate terminal (i.e., N4) of the N-type field effect transistor of second driving element 1044 equals the voltage drop between the source terminal Ns4 and the gate terminal (i.e., N4) of the N-type field effect transistor of the second sensing element 1064a, the second driving current I2 is mirrored to the second sensing element 1064a such that the second sensing current Is2 is also a large current when the second driving current I2 becomes a large current. The second control current Ic2 is then fed to the second output terminal N4 of the first stage 102 through the second control element 1066 to decrease the voltage level of the second control signal Vc2. Therefore, by reducing the dropout voltage between the gate terminal and the source terminal of the N-type field effect transistor (i.e., the second driving element 1044), the second driving current I2 is reduced. Please note that, according to this embodiment, the above-mentioned feedback loop is designed to adjust the second control signal Vc2 to reduce the second driving current I2 to a target current level (i.e., the fourth predetermined threshold current Ith4) which is greater than zero. Then, the above-mentioned feedback loop maintains the second driving current I2 to lock to the fourth predetermined threshold current Ith4 until the output terminal N9 of the second stage 104 is disconnected from the supply voltage Vdd. In other words, the second driving current I2 is reduced to a small leakage current (i.e., the fourth predetermined threshold current Ith4) when the operational circuit 100 enters the abnormal operation. Similarly, when the output terminal N9 of the second stage 104 is disconnected from the supply voltage Vdd and connected to a correct terminal, the operational circuit 100 enters the normal mode again. More specifically, when the specific detecting circuit 108 detects that the output terminal N9 is connected to a correct terminal, the specific detecting circuit 108 disconnects (i.e., switches off) the first terminal N8 of the second control element 1066 from the second terminal (i.e., N4) of the second control element 1066 and controls the second adjustable current generator 1064b to switch the fourth reference current Ir4 into the third reference current Ir3.

Please note that the present invention switches the third reference current Ir3 into the fourth reference current Ir4, and locks the second driving current I2 into the fourth predetermined threshold current Ith2 rather than directly connecting the first terminal N8 of the second control element 1065 to the ground voltage Vgnd, which has the advantage of preventing the operational circuit 100 from oscillating.

Please note that one of the features of the operational circuit 100 is not to directly connect the supply voltage Vdd to the first output terminal N3 of the first stage 102, and not to directly connect the ground voltage Vgnd to the second output terminal N4 of the first stage 102. Therefore, the first adjusting element 1062 is not limited to a current generator; any other device that couples between the supply voltage Vdd and the first terminal N6 and is capable of being controlled to adjust the first control signal Vc1 to reduce the first driving current I1 to the second predetermined threshold current Ith2 also belongs to the scope of the present invention. Similarly, the second adjusting element 1065 is also not limited to a current generator; any other device that couples between the ground voltage Vgnd and the first terminal N8 and is capable of adjusting the second control signal Vc2 to reduce the second driving current I2 to the fourth predetermined threshold current Ith4 also belongs to the scope of the present invention. Furthermore, the operational circuit 100 is not limited to adjust both the first control signal Vc1 and the second control signal Vc2. In one embodiment, only portions of the protection circuit 106 (i.e., the first sensing element 1061a, the first adjustable current generator 1061b, the first current comparator 1061c, the first adjusting element 1062, and the first control element 1063) are employed in the operational circuit 100, and in another embodiment, the other portions of the protection circuit 106 (i.e., the second sensing element 1064a, the second adjustable current generator 1064b, the second current comparator 1064c, the second adjusting element 1065, and the second control element 1066) are employed in the operational circuit 100. Both these embodiments also possess the above-mentioned advantages of the present invention.

In addition, the present invention is not limited to comparing the first sensing current Is1 with the first reference current Ir1 and the second reference current Ir2 to generate the first detecting signal Sd1. Any other device capable of generating the first detecting signal Sd1 according to the first driving current I1 also belongs to the scope of the present invention. Similarly, the present invention is not limited to comparing the second sensing current Is2 with the third reference current Ir3 and the fourth reference current Ir4 to generate the second detecting signal Sd2. Any other device capable of generating the second detecting signal Sd2 according to the second driving current I2 also belongs to the scope of the present invention.

Figure 4:
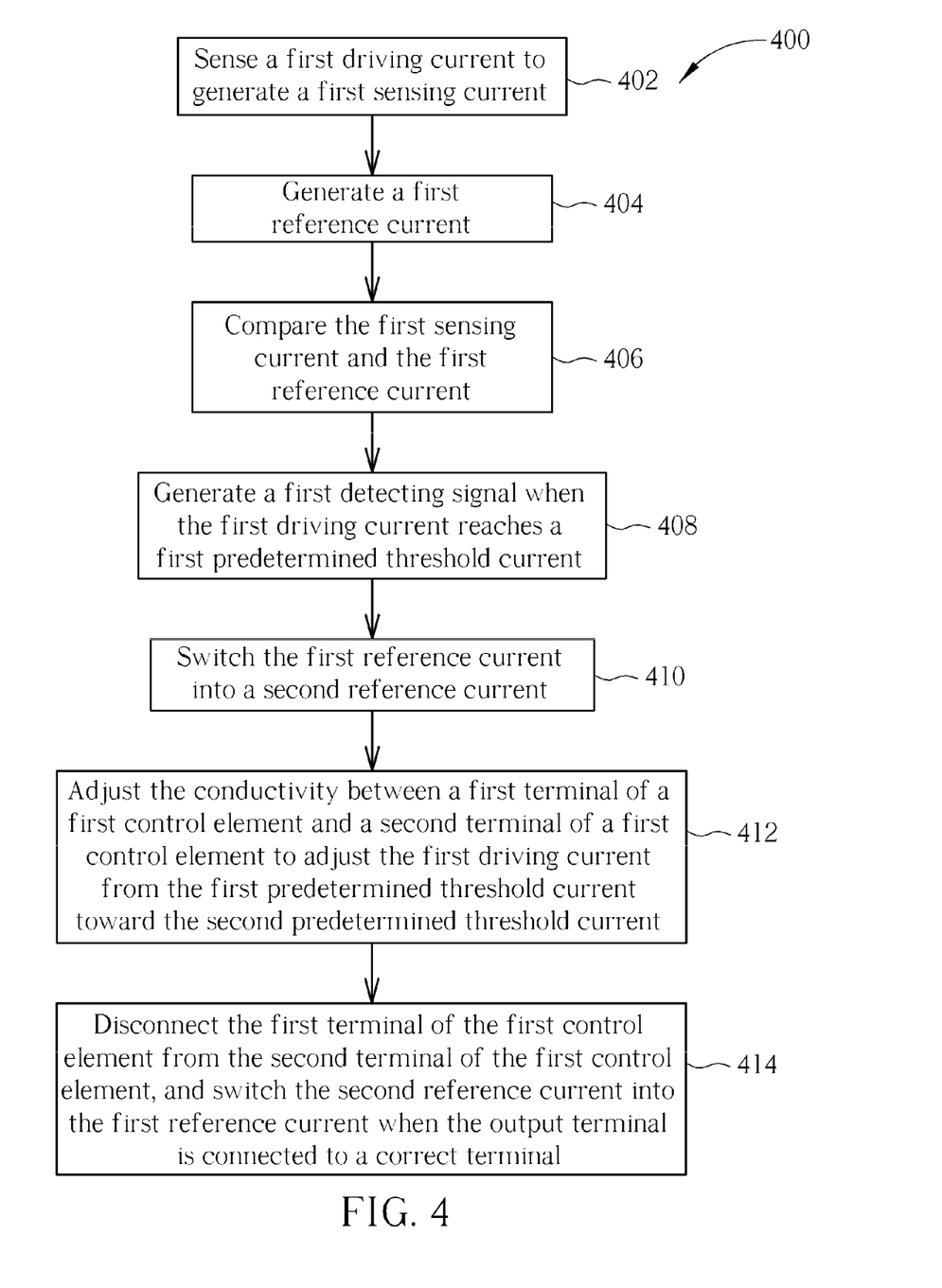
FIG. 4 is a flowchart illustrating a control method for the operational circuit according to an embodiment of the present invention.

Please refer to FIG. 4. FIG. 4 is a flowchart illustrating a control method 400 for an operational circuit according to an embodiment of the present invention. For brevity, the control method 400 is illustrated in conjunction with the operational circuit 100 shown in FIG. 1A, but this is not meant to be a limitation of the present invention. Provided that substantially the same result is achieved, the steps of the flowchart shown in FIG. 4 need not be in the exact order shown and need not be contiguous; that is, other steps can be intermediate. The control method 400 comprises the following steps:

Step 402: Sense the first driving current I1 to generate the first sensing current Is1;

Step 404: Generate the first reference current Ir1;

Step 406: Compare the first sensing current Is1 and the first reference current Ir1;

Step 408: Generate the first detecting signal Sd1 when the first driving current I1 reaches the first predetermined threshold current Ith1;

Step 410: Switch the first reference current Ir1 into the second reference current Ir2 according to the first detecting signal Sd1;

Step 412: Adjust the conductivity between the first terminal N6 of the first control element 1063 and the second terminal (i.e., N3) of the first control element 1063 to adjust the first driving current I1 from the first predetermined threshold current Ith1 towards the second predetermined threshold current Ith2 according to the first detecting signal Sd1;

Step 414: Disconnect the first terminal N6 of the first control element 1063 from the second terminal (i.e., N3) of the first control element 1063, and switch the second reference current Ir2 into the first reference current In when the output terminal N9 of the second stage 104 is connected to the correct terminal.

Please note that the control method 400 only illustrates the operation of portions of the protection circuit 106 (i.e., the first sensing element 1061a, the first adjustable current generator 1061b, the first current comparator 1061c, the first adjusting element 1062, and the first control element 1063) in the operational circuit 100; however, those skilled in this art will readily understand that the control method 400 may also be applicable to the operation of the other portions of the protection circuit 106 (i.e., the second sensing element 1064a, the second adjustable current generator 1064b, the second current comparator 1064c, the second adjusting element 1065, and the second control element 1066), and therefore detailed descriptions are omitted here for brevity. When the output terminal N9 of the second stage 104 is misconnected to the ground voltage Vgnd, the first driving current I1 is increased gradually. Meanwhile, the first sensing element 1061a senses the first driving current I1 to generate the first sensing current Is1 (Step 402), and the first current comparator 1061c compares the first sensing current Is1 and the first reference current Ir1 (Steps 404, 406). When the first driving current I1 reaches the first predetermined threshold current Ith1, the first current comparator 1061c generates the first detecting signal Sd1 (step 408) to switch the first reference current Ir1 into the second reference current Ir2 (step 410), and to adjust the conductivity between the first terminal N6 of the first control element 1063 and the second terminal (i.e., N3) of the first control element 1063 to adjust the first driving current I1 from the first predetermined threshold current Ith1 towards the second predetermined threshold current Ith2 (step 412). More specifically, the first control current Ic1 is then fed to the first output terminal N3 of the first stage 102 through the first control element 1063 to increase the voltage level of the first control signal Vc1. Accordingly, the dropout voltage between the gate terminal and the source terminal of the P-type field effect transistor (i.e., the first driving element 1042) is reduced. Therefore, by reducing the dropout voltage between the gate terminal and the source terminal of the P-type field effect transistor, the driving current I1 is reduced. Please note that the feedback loop consisting of the first sensing element 1061a, the first adjustable current generator 1061b, the first current comparator 1061c, the first adjusting element 1062, and the first control element 1063 is designed to adjust the first control signal Vc1 to reduce the first driving current I1 to a target current level (i.e., the second predetermined threshold current Ith2) which is greater than zero. Then, the feedback loop maintains the first driving current I1 to lock to the second predetermined threshold current Ith2 until the output terminal N9 of the second stage 104 is disconnected from the ground voltage Vgnd. In other words, the first driving current I1 is reduced to a small leakage current (i.e., the second predetermined threshold current Ith2) when the operational circuit 100 enters the abnormal operation. When the output terminal N9 of the second stage 104 is disconnected from the ground voltage Vgnd and connected to a correct terminal, the operational circuit 100 enters the normal mode again. More specifically, when the specific detecting circuit 108 detects that the output terminal N9 is connected to a correct terminal, the specific detecting circuit 108 disconnects (i.e., switches off) the first terminal N6 of the first control element 1063 from the second terminal (i.e., N3) of the first control element 1063 and controls the first adjustable current generator 1061b to switch the second reference current Ir2 into the first reference current Ir1 (step 414).

Briefly, the above-mentioned embodiments reduce the leakage current to an extremely low value but do not turn off the driving transistors in the second stage 104 in order to keep the operational circuit 100 stable when the output terminal N9 of the operational circuit 100 is misconnected to the supply voltage Vdd or ground voltage Vgnd.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational circuit, comprising:
a first stage, having a first input terminal for receiving an input signal and a second input terminal for receiving an output signal of the operational circuit, for outputting a first control signal at a first output terminal and a second control signal at a second output terminal according to the input signal and the output signal;

a second stage, coupled to the first stage, for generating the output signal according to a first driving current controlled by the first control signal and a second driving current controlled by the second control signal; and a protection circuit, coupled between the first stage and the second stage, for adjusting the first driving current from a first predetermined threshold current towards a second predetermined threshold current when the first driving current reaches the first predetermined threshold current;

wherein the protection circuit comprises:

a first detecting element, for detecting the first driving current to selectively generate a first detecting signal;

a first adjusting element, having a first terminal coupled to a first supply voltage; and a first control element, having a first terminal coupled to a second terminal of the first adjusting element, and a second terminal coupled to the first output terminal of the first stage, wherein the first detecting element generates the first detecting signal to adjust a conductivity between the first terminal of the first control element and the second terminal of the first control element when the first driving current reaches the first predetermined threshold current; and the second stage comprises:

a first driving element, coupled to the first output terminal of the first stage, for receiving the first control signal to generate the first driving current; and a second driving element, coupled to the second output terminal of the first stage, for receiving the second control signal to generate the second driving current; and the first detecting element comprises:

a sensing element, coupled to the first output terminal, for sensing the first driving current to generate a first sensing current;

an adjustable current generator, for selectively generating a first reference current with respect to the first predetermined threshold current or a second reference current with respect to the second predetermined threshold current; and a current comparator, coupled to the sensing element and the adjustable current generator, for comparing the first sensing current and the first reference current before the first driving current reaches the first predetermined threshold current, and comparing the first sensing current and the second reference current to generate the first detecting signal when the first driving current reaches the first predetermined threshold current; and the operational circuit further comprises:

a specific detecting circuit, coupled to the second stage, arranged to disconnect the first terminal of the first control element from the second terminal of the first control element, and to control the adjustable current generator to switch the second reference current into the first reference current according to the output signal.

2. The operational circuit of claim 1, wherein the first driving current is a sourcing current of the second stage.

3. The operational circuit of claim 1, wherein the first driving current is a sinking current of the second stage.

4. The operational circuit of claim 1, wherein the protection circuit generates the first sensing current with respect to the first driving current, and before the first driving current reaches the first predetermined threshold current, the protection circuit compares the first sensing current with the first reference current with respect to the first predetermined threshold current.

5. The operational circuit of claim 4, wherein when the first driving current reaches the first predetermined threshold current, the protection circuit compares the first sensing current with the second reference current with respect to the second predetermined threshold current to adjust the first control signal to thereby reduce the first driving current towards the second predetermined threshold current.

6. The operational circuit of claim 4, wherein the protection circuit further generates a second sensing current with respect to the second driving current, and before the second driving current reaches a third predetermined threshold current, the protection circuit compares the second sensing current with a third reference current with respect to the third predetermined threshold current.

7. The operational circuit of claim 6, wherein when the second driving current reaches the third predetermined threshold current, the protection circuit further compares the second sensing current with a fourth reference current with respect to a fourth predetermined threshold current to adjust the second control signal to thereby reduce the second driving current towards the fourth predetermined threshold current.

8. The operational circuit of claim 1, wherein the first detecting signal is further arranged to control the adjustable current generator to switch the first reference current into the second reference current when the first driving current reaches the first predetermined threshold current.

9. The operational circuit of claim 1, wherein the first adjusting element is a current generator for providing a control current when the first detecting element adjusts the conductivity between the first terminal of the first control element and the second terminal of the first control element.

10. The operational circuit of claim 1, wherein the protection circuit further comprises:

a second detecting element, for detecting the second driving current to selectively generate a second detecting signal;

a second adjusting element, having a first terminal coupled to a second supply voltage; and a second control element, having a first terminal coupled to a second terminal of the second adjusting element, and a second terminal coupled to the second output terminal of the first stage, wherein the second detecting element generates the second detecting signal to adjust a conductivity between the first terminal of the second control element and the second terminal of the second control element when the second driving current reaches a third predetermined threshold current to adjust the second driving current towards a fourth predetermined threshold current.

* * * * *